(12) United States Patent
Tsugai

(10) Patent No.: US 6,278,283 B1
(45) Date of Patent: Aug. 21, 2001

(54) CAPACITANCE DETECTING CIRCUIT

(75) Inventor: Masahiro Tsugai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/164,628

(22) Filed: Oct. 1, 1998

(30) Foreign Application Priority Data

May 11, 1998 (JP) .................................................. 10-127821

(51) Int. Cl.⁷ ...................................................... G01R 27/26
(52) U.S. Cl. ............................................................ 324/678
(58) Field of Search ................................... 324/678, 679; 73/514.32, 514.18; 327/51

(56) References Cited

U.S. PATENT DOCUMENTS 5,612,494 * 3/1997 Shibano ............................. 73/514.32

FOREIGN PATENT DOCUMENTS

| | | |
|---|---|---|
| 3831593 | 9/1988 | (DE) . |
| 4313327 | 4/1993 | (DE) . |
| 19520049 | 5/1995 | (DE) . |
| 19739532 | 9/1997 | (DE) . |
| 19753682 | 12/1997 | (DE) . |

WO9203740    3/1992    (WO) .

OTHER PUBLICATIONS

Gregorian et al., "Switched–Capacitor Circuit Design", Proceedings of the IEEE, vol. 71, No. 8, Aug. 1983, pp. 941–965.

* cited by examiner

*Primary Examiner*—Safet Metjahic
*Assistant Examiner*—E P LeRoux
(74) *Attorney, Agent, or Firm*—Leydig, Voit & Mayer, Ltd.

(57) ABSTRACT

A capacitance detecting circuit which can ensure flexibility in application without restriction imposed by a capacitance arrangement such as a single capacitance, differential capacitance, differential capacitance electrostatic servo and like arrangements, to a great advantage includes an operational amplifier having an inverting input terminal and an output terminal between which a feedback capacitance component is connected, a capacitance sensor having an electrostatic capacitance subjected to change under action of an external force, a switch for electrically charging the capacitance component of the capacitance sensor by connecting a charge/discharge terminal of the capacitance component to a reference voltage at a first clock timing for discharging the feedback capacitance component and switching the charge/discharge terminal to the feedback capacitance component at a second clock timing to transfer electric charge, and a sample-and-hold circuit for converting the transferred electric charge to the sensor output voltage.

9 Claims, 9 Drawing Sheets

CAPACITANCE DETECTING CIRCUIT

BACKGROUND OF THE INVENTION

1. Field of the Invention

The present invention relates to a capacitance detecting circuit for a capacitance-type sensor used for measurement of pressure, acceleration, angular velocity and the like.

2. Description of Related Art

As a sensor for detecting pressure of fluid, acceleration or angular velocity of a moving object or the like, the capacitance-type sensor is attracting attention which can detect the pressure, acceleration or the angular velocity by detecting change of capacitance of a capacitor. In particular, the sensor implemented by resorting to semiconductor micromachining techniques provide advantages such as miniaturized implementation of the device incorporating the sensor, enhanced manufacturability on a mass-production basis, realization of high precision and high reliability and so forth.

Figure 7:
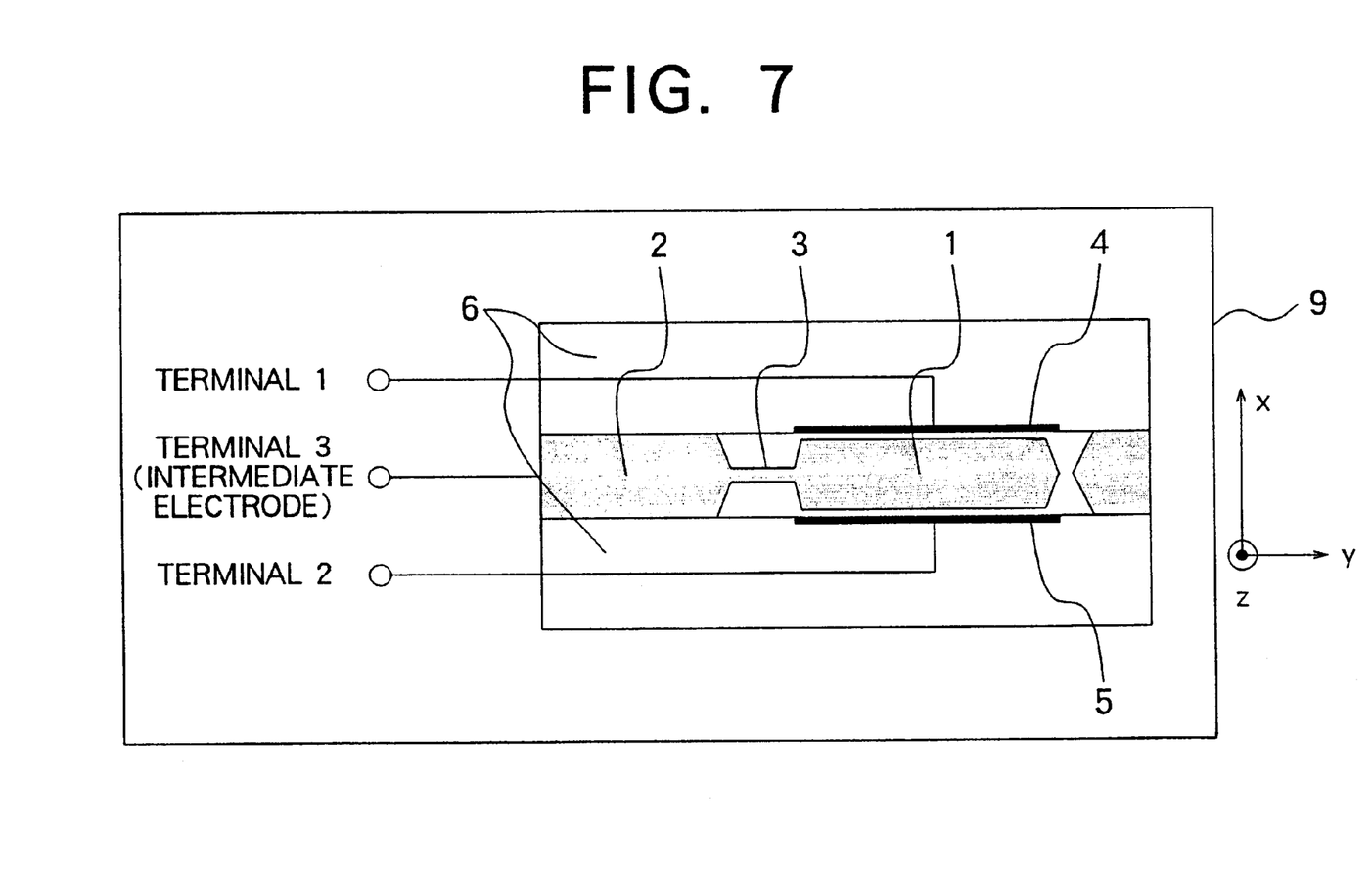
FIG. 7 is a cross-sectional view showing a hitherto known capacitance-type acceleration sensor.
Figure 8:
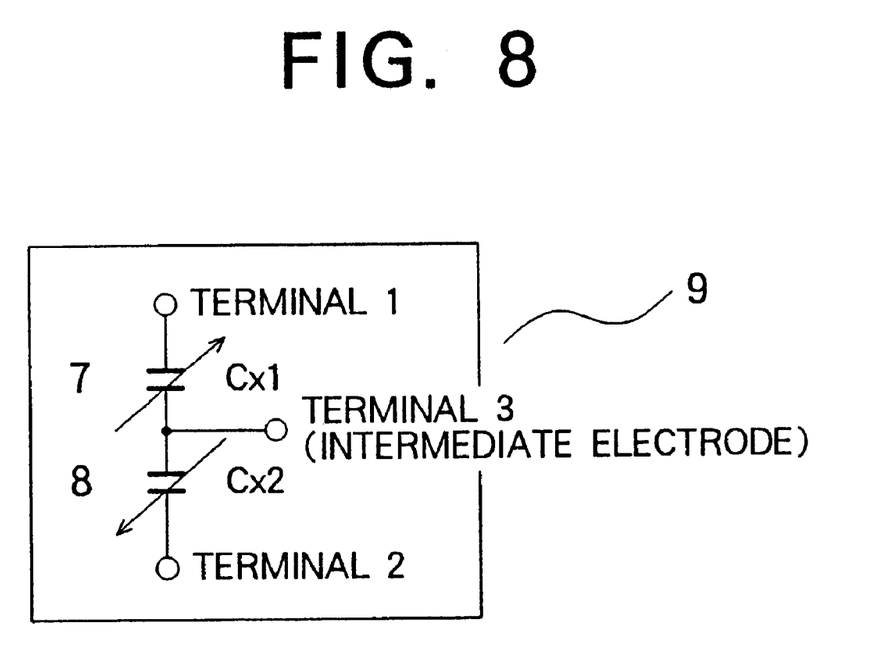
FIG. 8 is a circuit diagram showing an equivalent circuit of the conventional capacitance-type acceleration sensor shown in FIG. 7.

For a better understanding of the invention, background techniques will first be described in some detail. FIG. 7 is a cross-sectional view showing a typical capacitance-type acceleration sensor manufactured through a semiconductor micromachining process. As can be seen in the figure, the capacitance-type acceleration sensor is implemented such that a silicon inertial mass member 1 serving as an electric conductor is supported on a anchor portion 2 by a cantilever portion 3. stationary electrodes 4 and 5 formed on a glass or silicone plate 6 are disposed, respectively, above and below the inertial mass member 1. As can ready be understood, the inertial mass member 1 and the stationary electrodes 4 and 5 constitute capacitors 7 and 8, respectively, as shown in FIG. 8, which is an equivalent circuit of the capacitance-type acceleration sensor shown in FIG. 7.

The capacitors 7 and 8 constitute a sensor element 9. When an inertial force brought about by acceleration acts on the inertial mass member 1 in the x-direction, the inertial mass member 1 is displaced by u in the x-direction. Due to this u, one of the difference voltages between the inertial mass member 1 and the stationary electrodes 4 and 5 increases by ΔC to a value (C−ΔC). In this manner, when the capacitance-type acceleration sensor is subjected to acceleration, differential capacitance changes take place.

Figure 9:
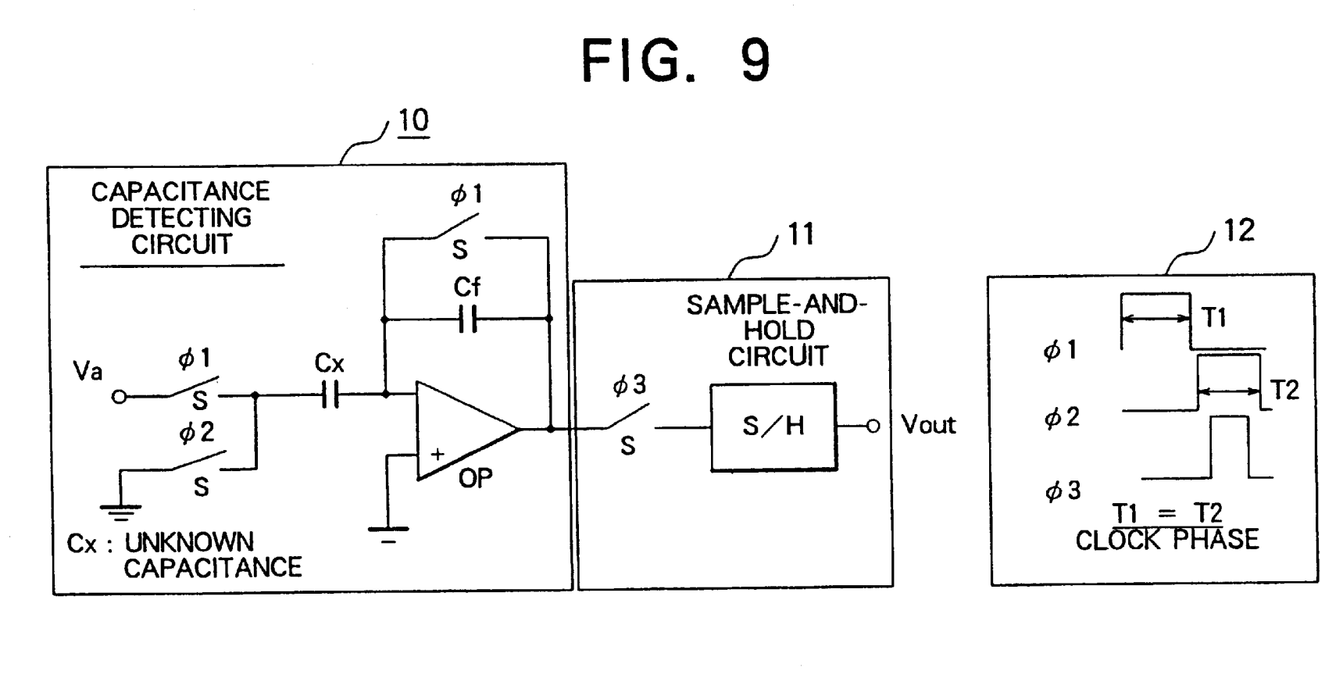
FIG. 9 is a circuit diagram showing an example of the hitherto known capacitance detecting circuit.

A method of converting the differential capacitance change brought about by the displacement of the inertial mass member 1 may be realized by using an impedance-conversion circuit, as already proposed by the applicant of the present application. FIG. 9 shows, by way of example, a hitherto known circuit capable of outputting output voltage in proportion to change in an unknown capacitance Cx and shows a timing chart for illustrating operation of the capacitance detecting circuit.

Referring to FIG. 9, a capacitance detecting circuit 10 includes an operational amplifier OP, wherein a feedback capacitance Cf is connected between input and output terminals of the operational amplifier OP. The feedback capacitance Cf is short-circuited during a time period T1 by a switch S at a time point or timing $\phi 1$. The unknown capacitance Cx is connected to the non-inverting input terminal of the operational amplifier OP. A supply voltage Va is applied to the unknown capacitance Cx during the period T1 at the timing $\phi 1$. After lapse of the period T1, the unknown capacitance Cx is coupled to the ground potential during a time period T2 by the switch S at a time point or timing $\phi 2$. The output terminal of the operational amplifier OP is connected to a sample-and-hold circuit 11 by means of the switch S during the period T2 at a timing $\phi 3$.

In the capacitance detecting circuit 10 shown in FIG. 8, the supply voltage Va is applied to the unknown capacitance Cx during the period T1. Since the inverting input terminal of the operational amplifier is connected to a virtual ground potential by way of the non-inverting input terminal due to imaginary shorting of the operational amplifier, electric charge is stored in the unknown capacitance Cx and stored in the feedback capacitance Cf is discharged by way of the switch S.

After lapse of the period T1, the unknown capacitance Cx is connected to the ground potential by means of the switch S at the timing $\phi 2$. As a result, the electric charge stored in the unknown capacitance Cx migrates to the feedback capacitance Cf, whereby the reference voltage Vc is realized. At the timing $\phi 3$, a saturation output voltage Vout generated by the sample-and-hold circuit 11 can be given by the undermentioned expression (1):

$$\text{Vout} = (Cx/Cf) \cdot Va \quad (1)$$

As can be seen from the expression (1), the saturation output voltage Vout assumes a value which is in proportion to the unknown capacitance Cx.

The conventional capacitance detecting circuit implemented in the structure described above suffers however problems which will be mentioned below.

(1) The mean external force acting between pole plates of the unknown capacitance Cx over one clock period is determined only by the supply voltage Va. Thus, the external force can not be reduced to zero unless the supply voltage Va is set to zero.

(2) The saturation output voltage Vout is forcibly set in phase with the change of the unknown capacitance Cx.

(3) The differential capacitance type sensor can not be applied intact to the conventional capacitance detecting circuit known heretofore. More specifically, in the differential capacitance type sensor, the terminal 3 of the equivalent circuit shown in FIGS. 7 and 8 corresponds to the inertial mass member 1 of the sensor. By adjusting the potential difference between the terminals 1 and 3 and the potential difference between the terminals 2 and 3, an external force acts to cancel out the displacement of the inertial mass member 1 in the x-direction due to acceleration. However, the circuit structure such as shown in FIG. 9 can not be applied to the differential capacitance/servo-type sensor.

As is apparent from the above, the conventional capacitance detecting circuit lacks flexibility in respect to the utilization of the output signal as well as application to the sensors.

SUMMARY OF THE INVENTION

In the light of the state of the art described above, it is an object of the present invention to provide a capacitance detecting circuit which can be applied to as many various types of capacitance-type sensors as conceivable, such as a single-capacitance-type sensor, differential capacitance type sensor, differential capacitance/servo-type sensor and the like.

In view of the above and other objects which will become apparent as the description proceeds, there is provided according to a general aspect of the present invention a capacitance detecting circuit, which includes an operational amplifier having an inverting input terminal and an output terminal between which a feedback capacitance component is connected, a capacitance-type sensor having an electrostatic capacitance subjected to change under action of an external force, a charge/discharge control means for electrically charging the capacitance component of the capacitance-type sensor by connecting a charge/discharge terminal of the capacitance component to a reference voltage source at a first clock timing for discharging the feedback capacitance component and changing over the charge/discharge terminal to the feedback capacitance component at a second clock timing to thereby transfer electric charge, and a voltage converting means for converting the transferred electric charge to a voltage to thereby output the voltage as a sensor output voltage.

In an exemplary preferred mode for carrying out the invention, the capacitance-type sensor may be implemented as a differential capacitance type sensor having first and second capacitances, one of which is caused to increase with the other being caused to decrease under action of a same external force, wherein the charge/discharge control means connects the charge/discharge terminal of the first and second capacitances to the reference voltage source at the first clock timing for thereby electrically charging the first and second capacitances while changing over the charge/discharge terminal to the feedback capacitance component at the second clock timing, whereby a quantity of electric charge which corresponds to a difference between the first and second capacitances is transferred to the voltage converting means.

In another exemplary preferred mode for carrying out the invention, the capacitance detecting circuit may further include two operational amplifiers each having an inverting input terminal and an output terminal between which a feedback capacitance component is connected. The charge/discharge control means may connect the charge/discharge terminal of the first and second capacitances in the differential capacitance type sensor to the reference voltage source at the first clock timing for thereby electrically charging the first and second capacitances while changing over the charge/discharge terminal to the feedback capacitance components of the first and second at the second clock timing, whereby electric charges stored in the first capacitance component and the capacitance component are transferred to the voltage converting means.

In yet another exemplary preferred mode for carrying out the invention, the capacitance detecting circuit may be so arranged as to include a difference voltage output means for determining a difference voltage between voltages resulting from voltage conversion of electric charges in the first and second capacitances, respectively, to thereby output the difference voltage as a voltage conversion value of the sensor output.

In still another exemplary preferred mode for carrying out the invention, the capacitance detecting circuit may further be so arranged as to include a feedback control means for feeding back the voltage conversion value as the reference voltage to a common terminal of the first and second capacitances of the differential capacitance type sensor.

In a further exemplary preferred mode for carrying out the invention, the feedback control means may be so designed as to be constituted by a compensating means and a gain regulating means.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

The present invention will be described in detail in conjunction with what is presently considered as preferred or typical embodiments thereof by reference to the drawings.

Embodiment 1

Figure 1:
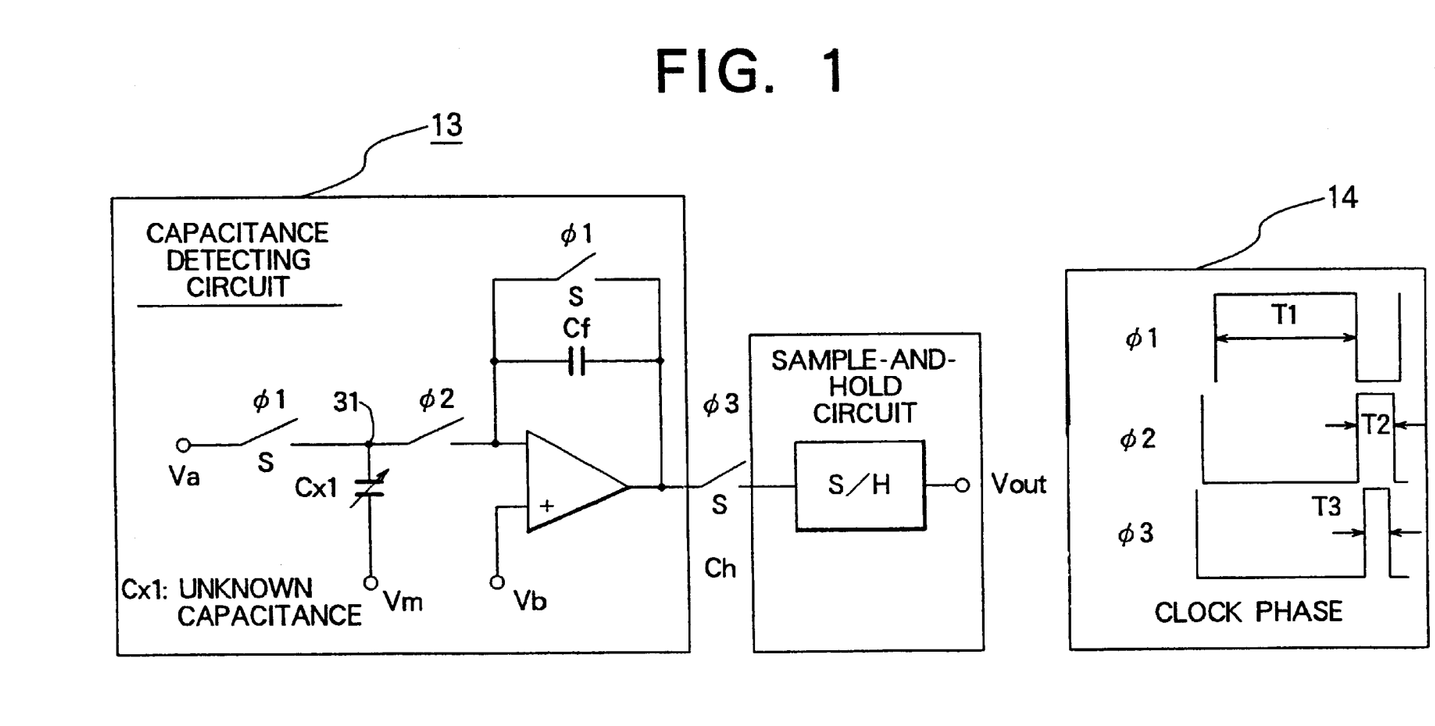
FIG. 1 is a circuit diagram showing a capacitance detecting circuit according to a first embodiment of the present invention.

Now, description will be made of the capacitance detecting circuit according to a first embodiment of the present invention. As is shown in FIG. 1, in the capacitance detecting circuit according to the instant embodiment of the invention, it is presumed that one capacitance-type sensor element is connected. The capacitance detecting circuit now under consideration is implemented in the form of an SC-type capacitance detecting circuit having three reference voltages Va, Vb and Vm in contrast to the conventional SC-type capacitance detecting circuit. At this juncture, it should be mentioned that the individual switches mentioned are part of a change/discharge control means, while the operational amplifier OP is part of a voltage converting means.

The clock timing and the time period for driving the switches are so set that the on-time period T1 starting at the timing φ1 and the on-time period T2 starting at the timing φ1 are changed as occasion requires. Further, the on-time period T3 is so set as to fall within the on-time period T2.

Referring to FIG. 1, unknown capacitance Cx1 has a reference voltage terminal connected to a reference voltage Vm, while the charge/discharge terminal 31 of the unknown capacitance Cx1 is connected to the reference voltage source Va by way of a switch S which is closed at the timing φ1 and additionally to and additionally to the inverting input terminal of the operational amplifier OP by way of a switch S closed at the timing φ2. The non-inverting input terminal of the operational amplifier is connected to another reference voltage source Vb.

By virtue of the circuit arrangement described above, the charge/discharge terminal 31 of the unknown capacitance Cx1 is connected to the reference voltage source Va at the timing φ1, whereby the unknown capacitance Cx1 is electrically charged. On the other hand, at the same timing φ1, the electric charge remaining in the feedback capacitance Cf is discharged by way of the switch S. Subsequently, at the timing φ2, the charge/discharge terminal of the unknown capacitance Cx1 is connected by the switch S to the inverting input terminal of the operational amplifier OP. As a result of this, the electric charge stored in the unknown capacitance Cx1 is transferred to the feedback capacitance Cf. The operational amplifier converts the electric charge to a voltage. At the timing φ3, the voltage resulting from the voltage conversion is supplied to a succeeding sample-and-hold circuit by way of a switching element. The saturation output voltage Vout of the sample-and-hold circuit can be given by the following expression:

$$Vout=Vb-(Va-Vb)\cdot(Cx1/Cf) \quad (2)$$

As can be seen from the above expression (2), the saturation output voltage Vout is independent of the reference voltage Vm. In this conjunction, it should however be mentioned that the expression (2) holds true only when the reference voltage Vm undergoes to change during the clock period for driving the switch.

As is apparent from the expression (2), the output of the unknown capacitance Cx1 can be derived in phase or in opposite phase by selecting correspondingly magnitudes of the reference voltages Va and Vb. Further, detection sensitivity of the unknown capacitance Cx1 can be enhanced by adjusting the reference voltages Va and Vb so that the difference therebetween increases.

In the case of the electrostatic capacitance type sensor, it may be required to adjust the electrostatic attraction acting between the stationary electrodes 4 and 5 forming the sensor capacitance. With the circuit arrangement according to the instant embodiment of the invention, it is possible to make the mean inter-electrode electrostatic attraction over one clock period be zero by setting the reference voltage Vm so that the condition (Va+Vb)/2 can be satisfied. Further, by virtue of the circuit arrangement according to the instant embodiment of the invention the, magnitude of the inter-electrode attraction can be regulated in response to on the reference voltage Vm as set.

Further, by adjusting the durations of the on-time periods T1 and T2, the mean voltage applied to the charge/discharge terminal of the unknown capacitance Cx1 over one clock period can be regulated. Thus, it is possible to regulate or adjust both the reference voltage Vm and the inter-electrode electrostatic attraction.

Embodiment 2

Figure 2:
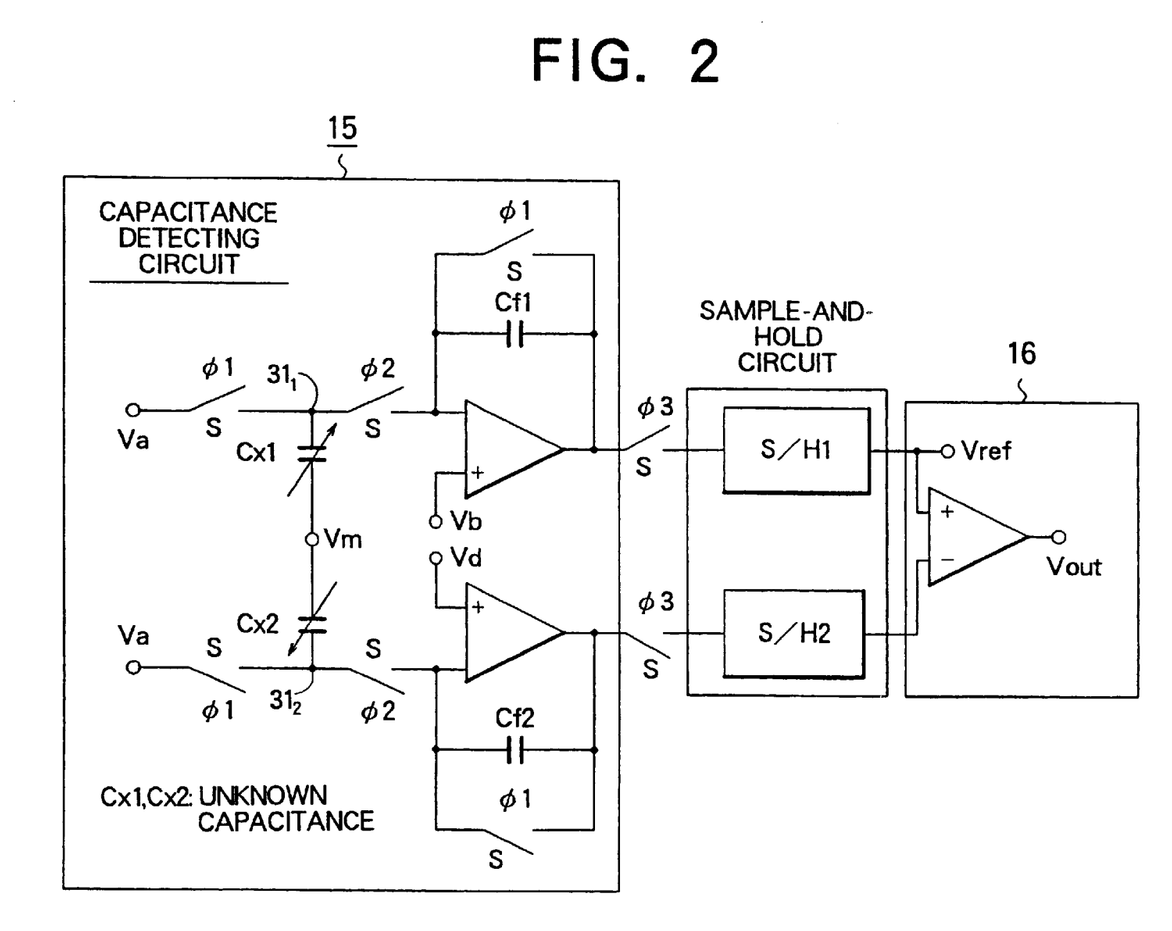
FIG. 2 is a circuit diagram showing a differential capacitance detecting circuit according to a second embodiment of the present invention.

Next, description will be directed to the capacitance detecting circuit according to a second embodiment of the present invention. FIG. 2 is a circuit diagram showing the capacitance detecting circuit according to the second embodiment of the invention. In the case of the capacitance detecting circuit now under consideration, there are provided a pair of capacitance detecting circuits and a pair of sample-and-hold circuits, wherein each capacitance detecting circuit and each sample-and-hold circuit is implemented essentially in same structures as those described hereinbefore in conjunction with the first embodiment. Further, the differential capacitance type sensor shown in FIGS. 7 and 8 is employed as the unknown capacitances Cx1 and Cx2, respectively. The charge/discharge terminals $31_1$ and $31_2$ of the differential capacitance type sensor are connected to the junctions of the switches S, respectively, which are operated at the timing φ1. The reference voltage Vm is applied to a cantilever portion 3 (intermediate terminal).

The output terminal of one sample-and-hold circuit is connected to an input terminal of the differential amplifier (constituting a differential voltage output means) to which the reference voltage Vref is applied, while the output terminal of the other sample-and-hold circuit is connected to the other input terminal of the differential amplifier.

The capacitance detecting circuit according to the instant embodiment of the invention is implemented in an SC-type capacitance detecting circuit applied to a differential capacitance type sensor in which electrostatic capacitances of the unknown capacitances Cx1 and Cx2 vary in opposite phase. The switch drive timings φ1, φ2 and φ3 are similar to those described hereinbefore in conjunction with the first embodiment of the invention.

In the case of the instant capacitance detecting circuit, there are used five reference voltages Va, Vb, Vc, Vd and Vm. Further, the capacitance detecting circuit includes two operational amplifiers OP1, OP2, two sample-and-hold circuits and one differential amplifier for outputting the difference voltage as the saturation output voltage Vout. In this conjunction, the differential amplifier may be replaced by an adder circuit without encountering any substantial problem.

The final output Vout of the capacitance detecting circuit can be given by the following expression (3) on the condition that the differential amplifier is employed as the output circuit as in the case of the capacitance detecting circuit according to the first embodiment of the invention.

$$Vout=Vref+(Vb-Vd)-\{(Va-Vb)Cx1-(Vc-Vd)Cx2\}/Cf \quad (3)$$

Assuming, by way of example, that Vb=Vd, and Va=Vc, the final output Vout can be given by the expression (4) provided that the differential amplifier is employed in the output circuit.

$$Vout=Vref-\Delta V(Cx1-Cx2)/Cf \quad (4)$$

where ΔV=Va−Vb.

As can be seen from the expression (4), there can be obtained the output voltage from the differential amplifier which is proportional to the difference between the unknown capacitances Cx1 and Cx2. By regulating the sign or polarity of the difference voltage ΔV, it is possible to adjust the displacement and the phase of the output voltage. Besides, by regulating appropriately the reference voltages Va, Vb, Vc, Vd and Vm, there can be obtained a cumulative output which is proportional to a sum of unknown capacitances Cx1 and Cx2.

Furthermore, by adjusting properly the reference voltage Vm and the on-time periods T1 and T2, it is equally possible to adjust the inter-electrode electrostatic attraction, as described hereinbefore in conjunction with the first embodiment, on the condition that the inter-electrode capacitance changes significantly slowly when compared with the clock period.

Embodiment 3

Figure 3:
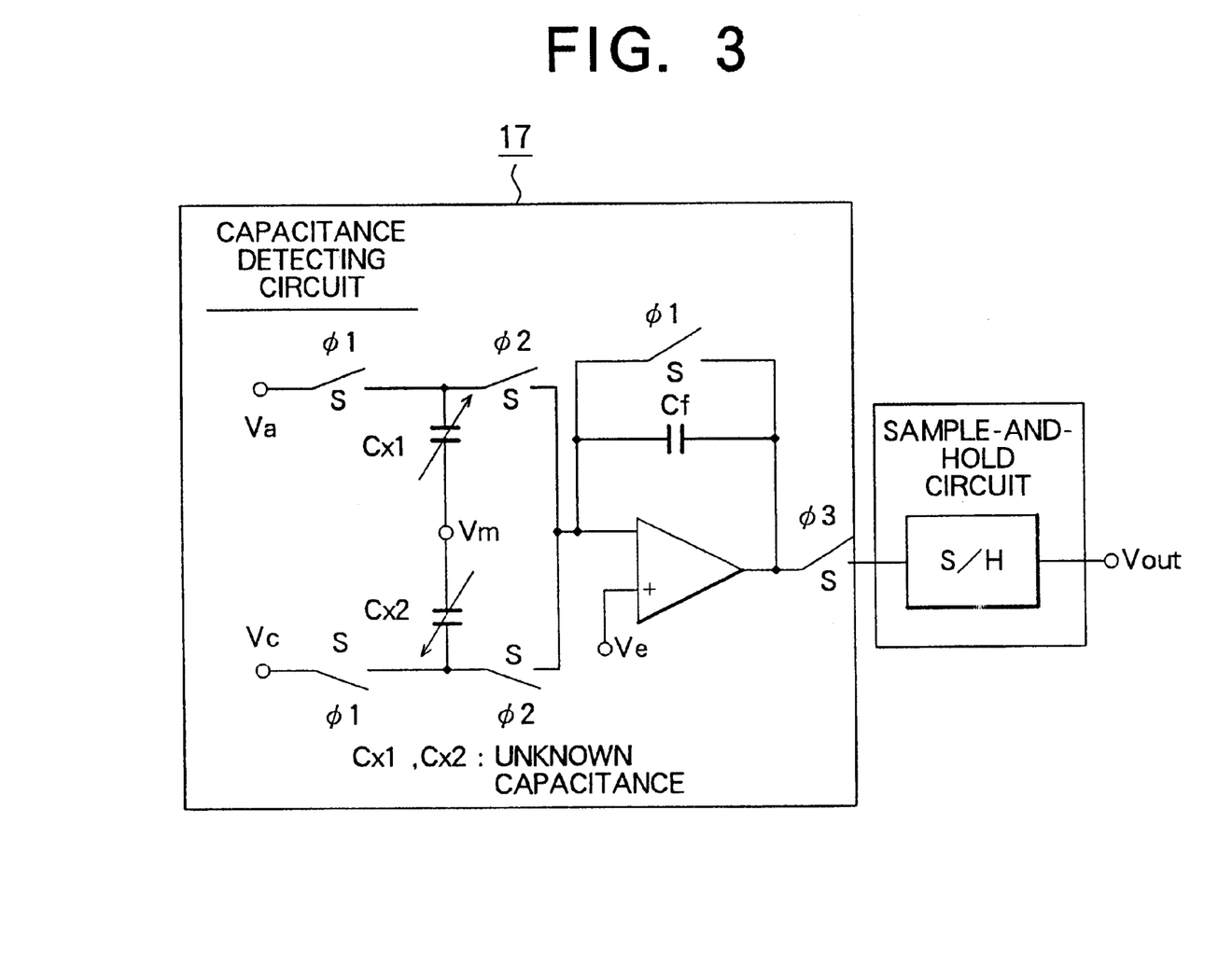
FIG. 3 is a circuit diagram showing a differential capacitance detecting circuit according to a third embodiment of the present invention.

Next, description will turn to the capacitance detecting circuit according to a third embodiment of the present invention. FIG. 3 is a circuit diagram showing the capacitance detecting circuit according to the instant embodiment of the invention. The capacitance detecting circuit now of concern differs from the capacitance detecting circuit shown in FIG. 1 in the respects that the inverting input terminal of the operational amplifier OP is connected in common to the output terminals of the two switches S driven at the timing φ2 and that the input terminals of these switches are connected in series to the switches S, respectively, which are driven at the timing φ1. The reference voltage Ve is applied to the non-inverting input terminal of the operational amplifier.

The switches S operating at the timing φ1 are applied with the reference voltages Va and Vc, respectively. Connected to the junctions of the series connections of the switches S are the charge/discharge terminals of the differential capacitance sensor having the unknown capacitances Cx1 and Cx2, which vary in opposite phase, as shown in FIG. 8, wherein the reference voltage Vm is applied to the reference voltage source terminal 3 (intermediate electrode).

The drive timings for the individual switches S are the same as those in the capacitance detecting circuit according to the first embodiment of the invention. In the case of the capacitance detecting circuit according to a second embodiment of the present invention, two operational amplifiers and two sample-and-hold circuits are required. By contrast, in the case of the capacitance detecting circuit according to the instant embodiment of the invention, one operational amplifier and one sample-and-hold circuit are employed. The final output Vout can be given by the following expression (5):

$$Vout=Ve-\{(Va-Ve)Cx1+(Vc-Ve)Cx2\}/Cf \quad (5)$$

Assuming, by way of example, that Va−Ve=Ve−Vc=ΔV, the expression (5) can be rewritten as follows:

$$Vout=Ve-\Delta V(Cx1-Cx2)/Cf \quad (6)$$

Thus, there can be obtained a differential output basically corresponding to the output Vout defined by the expression (4). Further, an accumulative output corresponding to a sum of unknown capacitances Cx1 and Cx2 can also be obtained by adjusting the reference voltage. Furthermore, in the case of the capacitance detecting circuit now under consideration, it is possible to adjust or regulate the magnitude of the inter-electrode electrostatic attraction by regulating properly the reference voltage Vm and the on-time periods T1 and T2, as described hereinbefore in conjunction with the first embodiment of the invention, on the condition that the inter-electrode capacitance changes sufficiently slowly when compared with the clock period.

Embodiment 4

Figure 4:
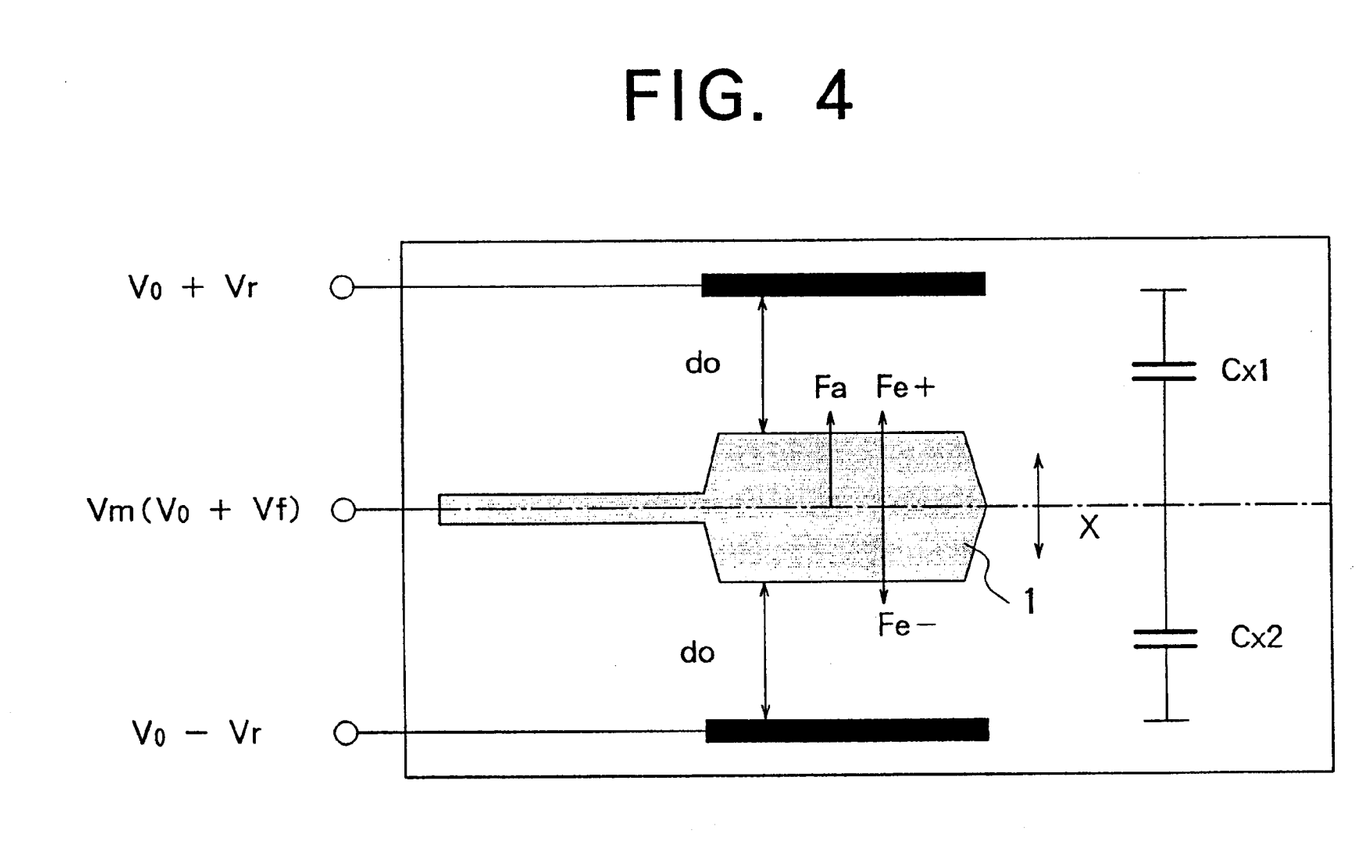
FIG. 4 is a cross-sectional view of a differential capacitance type sensor for illustrating a mechanism of an electrostatic servo system taught by the present invention.
Figure 5:
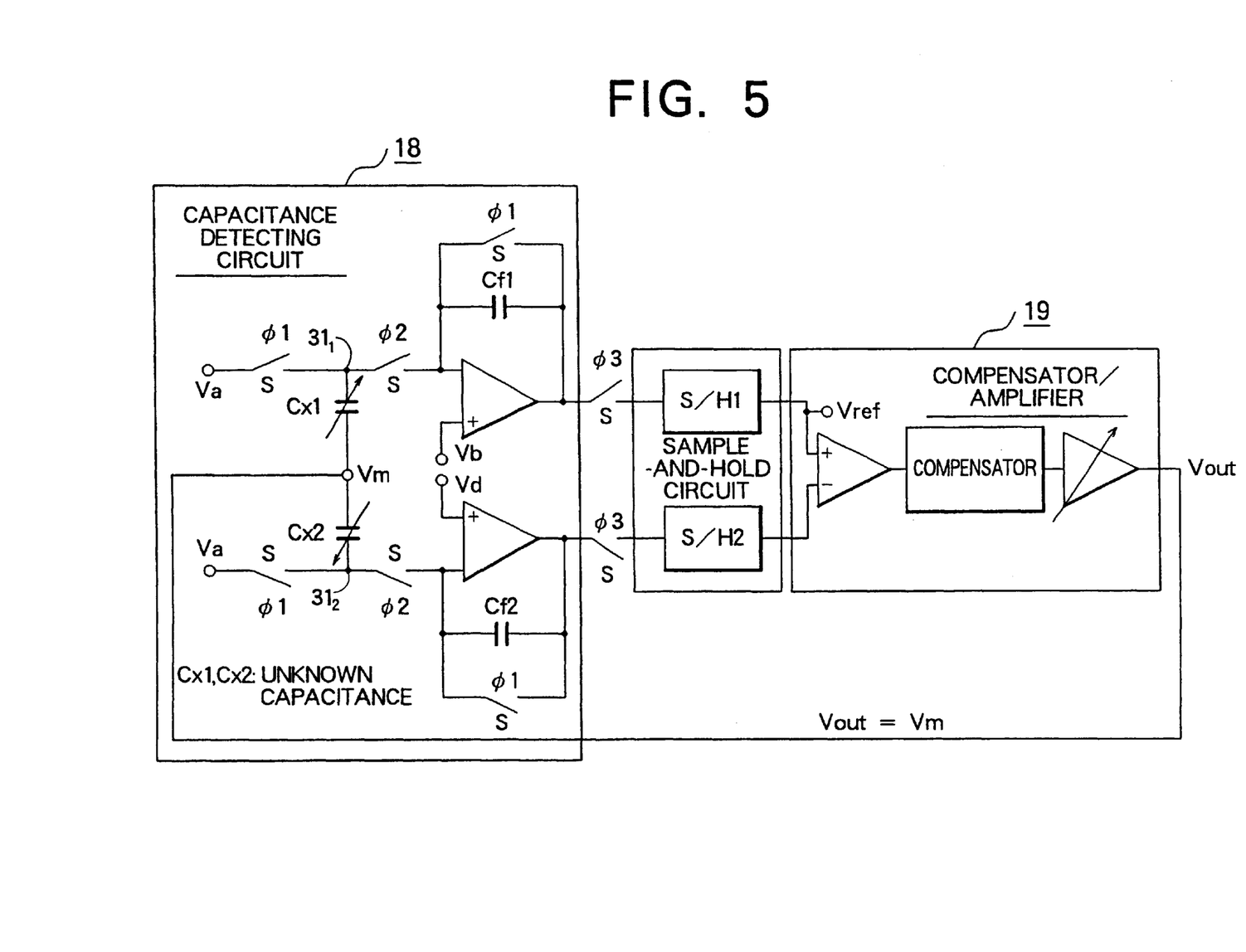
FIG. 5 is a circuit diagram showing a differential capacitance detecting circuit and an example of electrostatic servo system.

A fourth embodiment of the present invention will be described. FIG. 4 is a cross-sectional view of a differential capacitance sensor having unknown capacitances Cx1 and Cx2 which vary in opposite phase according to the fourth embodiment of the invention. FIG. 5 is a circuit diagram showing an SC-type capacitance detecting circuit applied to the differential capacitance type sensor. The drive timings φ1, φ2 and φ3 for the switching elements of the SC-type capacitance detecting circuit shown in FIG. 5 correspond to those adopted in the capacitance detecting circuit according to the first embodiment of the invention.

Incidentally, the SC-type capacitance detecting circuit can be applied to the electrostatic capacitance sensor of a servo system in which the zero method for limiting the displacement of the inertial mass member 1 is adopted, by making use of the detection circuit according to the second embodiment shown in FIG. 2. Taking as example an acceleration sensor, the servo system is so arranged as to vary the inter-electrode voltage so that the displacement of the inertial mass member (or the inertial force acting on the inertial mass member) brought about by the acceleration can be canceled out by the external force.

When compared with the conventional open-loop-type sensor, the frequency characteristic (response performance) can be improved because of the limitation of the displacement of the inertial mass member, and additionally the influence of noise can be suppressed owing to the feedback operation. Besides, when compared with the open-loop-type sensor exhibiting same response performance, it is expected that the ratio of the sensitivity to noise, i.e., the so-called signal-to-noise ratio, to say it in another way, can be improved because of sensitivity in appearance.

Next, referring to FIG. 4, the mechanism or principle underlying the arrangement for canceling the displacement of the inertial mass member 1 brought about by acceleration (the inertial force acting on the inertial mass member) with the external force will be elucidated. It is assumed that the inertial mass member 1 supported by the cantilever having a spring constant k tends to be displaced by u in the plus x-direction under the action of the inertia force Fa (=ma, where m represents mass and a represents acceleration). In that case, when the displacement of the inertial mass member is prevented under the action of the differential electrostatic attraction acting between the plates by applying a voltage (Vo+Vr) to one terminal of the unknown capacitance Cx1 while applying a voltage (vo−Vr) to one terminal of the unknown capacitance Cx2 with a voltage (Vo+Vf) being applied to the intermediate common terminal, then the following expressions apply valid:

Because $Fe^+ - Fe^- - Fa = 0$, $$2E \cdot Vr \cdot Vf = ma \quad (7),$$

and $$Vf = ma/(2EVr) \quad (8)$$

In the above expressions, symbol E represents a constant determined by the area of the opposite electrode, inter-electrode gap d0 and dielectric constant of the medium existing between the electrodes, and it is assumed that the displacement u is very small when compared with the inter-electrode gap d0. Further, symbol Vo represents the reference electric potential of the intermediate electrode and symbol Vf represents a feedback voltage generated in response to the acceleration. Accordingly, the feedback voltage Vf should ideally be independent of the spring constant k and proportional to the acceleration a.

FIG. 5 is a circuit diagram showing the capacitance detecting circuit implemented by adopting the principle mentioned above. For realizing a deviation voltage Vr for the reference potential Vo shown in FIG. 4, the reference voltages are set so as to satisfy the conditions given by the following expression (9):

$$Vo+Vr=(Va+Vb)/2$$

$$Vo+Vr=(Vc+Vd)/2 \quad (9)$$

Further, when the unknown capacitances Cx1 and Cx2 change differentially under the action of the acceleration, the scheme illustrated in FIG. 2 in conjunction with the second embodiment is adopted for measuring the direction and magnitude of such differential change. However, in the case of the servo system, response ordinarily becomes unstable due to feedback. Thus, it will be required to provide a compensator/amplifier 19 comprising a compensating circuit and an amplifier at the stage following the differential amplifier shown in FIG. 2, in order to adjust the phase and the feedback gain.

Since the deviation voltage Vr and the feedback voltage Vf represent parameters which a play major role in determining the external forces acting between the inertial mass member and the individual electrodes, they should preferably be as large as possible in order to make available the external force.

Setting of the deviation voltage Vr at a high value can be realized by adjusting the clock timings T1 and T2 in addition to regulation of reference voltages Va, Vb, Vc and Vd in the expression (9). In the case where T1=T2, the voltage applied across the terminals 1 and 2 (see FIG. 8) is given by the expression (9). However, in the case where T1>T2, it is possible to increase the deviation voltage Vr in accordance with the on/off duty ratio of the on-time periods T1 and T2, and for thereby set the deviation voltage Vr at a high level.

Embodiment 5

Figure 6:
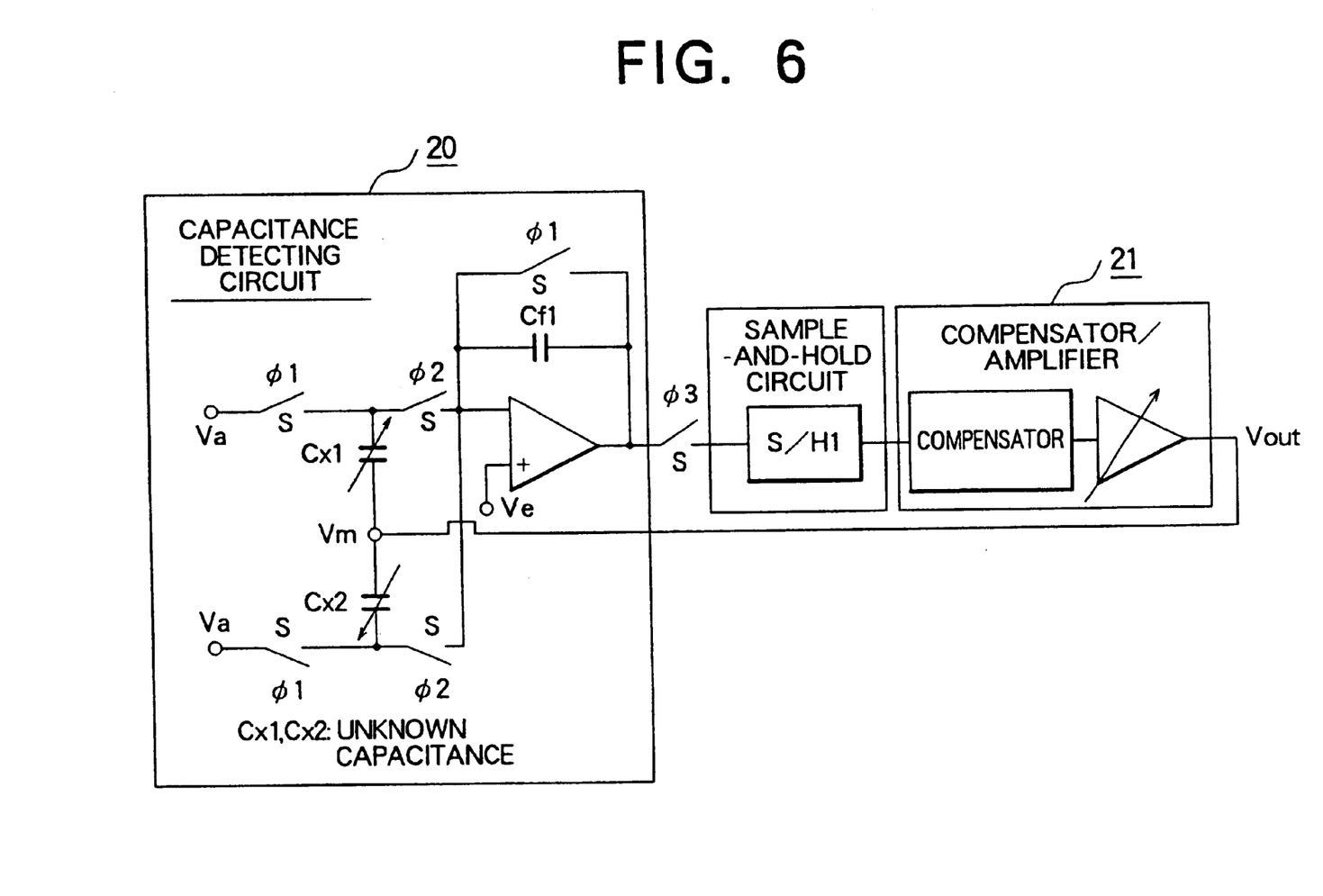
FIG. 6 is a circuit diagram showing a differential capacitance detecting circuit and another example of electrostatic servo system.

The capacitance detecting circuit according to a fifth embodiment of the present invention will be described. FIG. 6 is a circuit diagram showing the capacitance detecting circuit according to the instant embodiment of the invention. The capacitance detecting circuit now of concern is implemented as an SC-type capacitance detecting circuit applied to the differential capacitance type sensor and includes the unknown capacitance Cx1 and Cx2 which change in opposite phase.

The switch drive timings are identical with those in the capacitance detecting circuit according to the first embodiment of the invention. The capacitance detecting circuit now under consideration can be applied to the servo electrostatic capacitance sensor in which the zero method for limiting the displacement of the inertial mass member 1 is adopted by making use of the detection circuit shown in FIG. 3. The basic feedback arrangement is similar to that adopted in the capacitance detecting circuit according to the fourth embodiment of the invention. However, it is sufficient to employ only one sample-and-hold circuit. Besides, the differential amplifier can be spared. Thus, the capacitance detecting circuit now under consideration can be implemented in a much simplified structure to an advantage.

It is necessary to determine the individual reference voltages so that the condition of Vb=Vd=Ve can be satisfied in the expression (9). The deviation voltage Vr can be so regulated as to increase in accordance with the duty ratio by proper setting so that the condition of T1>T2 can be satisfied.

As will now be appreciated from the foregoing, there is provided according to the present invention a capacitance detecting circuit which can ensure flexibility in application thereof without undergoing restrictions imposed by the capacitance arrangement, such as single capacitance, differential capacitance, differential capacitance type electrostatic servo and like arrangements, to a great advantage.

Furthermore, because the capacitance detecting circuit according to the present invention is based on the simple SC-type capacitance detecting circuit while enabling the capacitance detection and the servo feedback, neither the synchronous detection circuit nor the precise clock generation circuit are required wherein compared with the conventional servo system circuits known heretofore. Further, there is no need for dividing the timing control for the capacitance detection and the servo feedback. By virtue of these features, there can be realized an interface circuit for the capacitance-type sensor which can ensure high accuracy and realizability and which can be manufactured at low cost.

Many modifications and variations of the present invention are possible in the light of the above techniques. It is therefore to be understood that within the scope of the appended claims, the invention may be practiced otherwise than as specifically described.

What is claimed is:

1. A capacitance detecting circuit comprising:
a feedback capacitance component;
an operational amplifier having an inverting input terminal and an output terminal, said feedback capacitance component being connected between the inverting input terminal and the output terminal;
a capacitance sensor having an electrostatic capacitance that changes in response to an external force applied to the sensor, said capacitance sensor having a charge/discharge terminal, and a reference terminal connected to a reference voltage; and
charge/discharge control means for disconnecting the charge/discharge terminal from the inverting input terminal of said operational amplifier and connecting the charge/discharge terminal of said capacitance sensor to a reference voltage source during a first time period for charging said electrostatic capacitance, and disconnecting the charge/discharge terminal from the reference voltage source and connecting the charge/discharge terminal to the inverting input terminal of said operational amplifier during a second time period, to transfer electric charge from the charge/discharge terminal of said capacitance sensor to the inverting input terminal of said operational amplifier, said operational amplifier converting the electric charge so transferred to a voltage as an output voltage of said capacitance sensor.

2. The capacitance detecting circuit according to claim 1, wherein said charge/discharge control means short-circuits said feedback capacitance component only during the first time period for discharging said feedback capacitance component.

3. A capacitance detecting circuit comprising:
a feedback capacitance component;
an operational amplifier having an inverting input terminal and an output terminal, said feedback capacitance component being connected between the inverting input terminal and the output terminal;
a differential capacitance sensor having first and second electrostatic capacitances that change in opposite directions in response to an external force applied to the sensor, said first and second electrostatic capacitances having respective charge/discharge terminals, and first and second common terminals, the first and second common terminals being connected to each other; and
charge/discharge control means for disconnecting the first and second charge/discharge terminals of said first and second electrostatic capacitances from the inverting input terminal of said operational amplifier and connecting the first and second charge/discharge terminals of said first and second electrostatic capacitances to first and second reference voltage sources during a first time period for charging said first and second electrostatic capacitances, and disconnecting the first and second charge/discharge terminals from the first and second reference voltage sources and connecting the first and second charge/discharge terminals to the inverting input terminal of said operational amplifier during a second time period, to transfer electric charge from the first and second charge/discharge terminals to the inverting input terminal of said operational amplifier, said operational amplifier converting the electric charge so transferred to a voltage as an output voltage of said differential capacitance sensor.

4. The capacitance detecting circuit according to claim 3, comprising feedback control means for feeding back the output voltage to the common terminals of said first and second electrostatic capacitances.

5. The capacitance detecting circuit according to claim 3, wherein said charge/discharge control means short-circuits said feedback capacitance component only during the first time period for discharging said feedback capacitance component.

6. A capacitance detecting circuit comprising:

first and second feedback capacitance components;

a first operational amplifier having an inverting input terminal and an output terminal, said first feedback capacitance component being connected between the inverting input terminal and the output terminal of said first operational amplifier;

a second operational amplifier having an inverting input terminal and an output terminal, said second feedback capacitance component being connected between the inverting input terminal and the output terminal of said second operational amplifier;

a differential capacitance sensor having first and second electrostatic capacitances that change in opposite directions in response to an external force applied to the sensor, said first and second electrostatic capacitances having respective charge/discharge terminals, and first and second common terminals, the first and second common terminals being connected to each other; and charge/discharge control means for disconnecting said first and second electrostatic capacitances from the inverting input terminals of said first and second operational amplifiers and connecting the first and second charge/discharge terminals of said first and second electrostatic capacitances to the second reference voltage source during a first time period for charging said first and second electrostatic capacitances, and disconnecting the first and second charge/discharge terminals from the first reference voltage source and connecting the first and second charge/discharge terminals respectively to the inverting input terminals of said first and second operational amplifier during a second time period, to transfer electric charge to the inverting input terminal of said first and second operational amplifiers, said first and second operational amplifiers converting the electric charge so transferred to first and second voltages as output voltages of said differential capacitance sensor.

7. The capacitance detecting circuit according to claim 6, comprising difference voltage output means receiving the first and second voltages and determining a difference voltage between the first and second voltages, and outputting the difference voltage as a voltage conversion value.

8. The capacitance detecting circuit according to claim 7, comprising feedback control means for feeding back the voltage conversion value as a reference voltage to the first and second common terminals of said first and second electrostatic capacitances of said differential capacitance sensor.

9. The capacitance detecting circuit according to claim 6, wherein said charge/discharge control means short-circuits said first and second feedback capacitance components only during the first time period for discharging said first and second feedback capacitance components.

* * * * *